United States Patent
Kim

(10) Patent No.: US 6,943,693 B2
(45) Date of Patent: Sep. 13, 2005

(54) METHOD FOR INFORMING USER OF AVAILABLE BATTERY TIME BASED ON OPERATING MODE OF HYBRID TERMINAL

(75) Inventor: Dae-Hwan Kim, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 39 days.

(21) Appl. No.: 10/459,971

(22) Filed: Jun. 12, 2003

(65) Prior Publication Data

US 2004/0070511 A1 Apr. 15, 2004

(30) Foreign Application Priority Data

Oct. 11, 2002 (KR) .................................. 10-2002-0062164

(51) Int. Cl.⁷ .............................................. G08B 21/00
(52) U.S. Cl. ............................. 340/636.1; 340/636.13; 340/636.19; 324/427; 324/433; 324/435; 320/132
(58) Field of Search .......................... 340/636.1, 636.13, 340/636.19; 324/425, 433, 435, 427; 320/132

(56) References Cited

U.S. PATENT DOCUMENTS

| | | | | |
|---|---|---|---|---|
| 4,949,046 A | * | 8/1990 | Seyfang | 324/427 |
| 4,984,185 A | * | 1/1991 | Saito | 713/321 |
| 5,182,655 A | * | 1/1993 | Motoyanagi | 358/406 |
| 5,206,578 A | * | 4/1993 | Nor | 320/118 |
| 5,434,508 A | * | 7/1995 | Ishida | 324/427 |
| 5,550,475 A | * | 8/1996 | Shafer | 324/433 |
| 5,656,919 A | * | 8/1997 | Proctor et al. | 320/153 |
| 5,675,258 A | * | 10/1997 | Kadouchi et al. | 324/433 |
| 6,051,957 A | * | 4/2000 | Klein | 320/132 |
| 6,414,466 B1 | * | 7/2002 | Ida | 320/132 |
| 2002/0094849 A1 | * | 7/2002 | Cannon et al. | 455/573 |
| 2004/0000913 A1 | * | 1/2004 | Raichle et al. | 324/426 |

* cited by examiner

Primary Examiner—Daniel Wu
Assistant Examiner—Samuel J. Walk
(74) Attorney, Agent, or Firm—Dilworth & Barrese LLP

(57) ABSTRACT

Disclosed is a method for informing a user of an available battery time of a battery in a hybrid terminal based on the operating mode of the hybrid terminal. The hybrid terminal has a plurality of modes and performs a function corresponding to a selection of the user. A battery current amount is subdivided into a plurality of current amount levels for each operating mode of the hybrid terminal, and an available battery time in each operating mode is calculated for each current amount level, so as to generate an available battery time table. The generated available battery time table is stored in a memory of the hybrid terminal. The operating mode of the hybrid terminal, and the amount of current supplied to the hybrid terminal are detected. An available battery time corresponding to the detected current amount is obtained from the available battery time table. A text or a sound message indicating the obtained available battery time is displayed.

7 Claims, 5 Drawing Sheets

(a)

(b)

(c)

(d)

METHOD FOR INFORMING USER OF AVAILABLE BATTERY TIME BASED ON OPERATING MODE OF HYBRID TERMINAL

PRIORITY

This application claims priority to an application entitled "METHOD FOR INFORMING USER OF AVAILABLE BATTERY TIME BASED ON OPERATING MODE OF HYBRID TERMINAL", filed in the Korean Industrial Property Office on Oct. 11, 2002 and assigned Ser. No. 2002-62164, the contents of which are hereby incorporated by reference.

BACKGROUND OF THE INVENTION

1. Field of the Invention

The present invention relates to a hybrid terminal, and more particularly to a method for informing a user of an available battery time of a hybrid terminal based on the operating mode of the hybrid terminal that has a plurality of operating modes and performs a function corresponding to a selection of a user.

2. Description of the Related Art

Due to the rapid development of the communication industry and the rapid extension of mobile communication services, a mobile communication terminal has become a necessary, and new communication terminals with various additional functions other than a telephone communication function are continually placed on the market to meet users' various wishes. Such mobile communication terminals have additional functions of, for example, a smart phone (a combination of a PDA (Personal Digital Assistant) and the mobile communication terminal), a camera phone (a mobile communication terminal equipped with a camera), an MP3 phone equipped with an MP3 (MPEG Audio Layer-3) player, a Bluetooth module, etc. Recently, various models of such mobile communication terminals having at least one additional function have been introduced into the market, and are typically called "hybrid terminals".

As shown in FIG. 1, a battery of the hybrid terminal includes a power supply terminal (Voltage Battery: VBT) 4, a voltage feedback terminal (VF) 3, a current feedback terminal (CF) 2, and a ground terminal (GND) 1. The battery receives a power supply voltage from a charger while the terminals thereof are connected to corresponding terminals disposed on a lower portion of a battery groove of the charger. The battery provides power supply voltage received from the charger to the hybrid terminal while the terminals thereof are connected to corresponding terminals disposed on a lower portion of the hybrid terminal.

Referring to FIG. 2, a description will be given of the configuration of the battery, the charger, and the hybrid terminal that are connected through the four terminals 1, 2, 3, and 4.

The battery 20 includes therein a terminal detection resistor Rv 21 connected to a terminal controller 13 of the hybrid terminal 10, and a charger detection resistor Rc 22 connected to a charger controller 32 of a charger 30.

The charger 30 includes a DC voltage converter 31, the charger controller 32, and a charger light-emitting unit 33. The DC voltage converter 31 converts an AC power supply voltage received through an outlet 38 to a DC power supply voltage, and then supplies the converted DC power supply voltage to the battery 20 through the power supply terminal 4. When the battery 20 is loaded in the charger, i.e., when the battery 20 is connected to the charger detection resistor 22 built in the battery 20 through the current feedback terminal 2, the charger controller 32 controls the charger light-emitting unit 33 to emit light indicating a loaded status of the battery 20. The charger controller 32 detects the level of voltage applied to and/or the amount of current flowing into the battery 20, and controls the charger light-emitting unit 33 to indicate a charging status of the battery 20, based on the detected voltage level or current amount.

As mentioned above, the charger light-emitting unit 33 emits light indicating the loaded status and the charging status of the battery, mainly using an LED (Light Emitting Diode), under the control of the charger controller 32. Generally, under the control of the charger controller 32, the charger light-emitting unit 33 emits a continuous red light until the completion of charging while the battery 20 is correctly loaded, and emits a blinking red light when the battery 20 is not correctly loaded. Under the control of the charger controller 33, the charger light-emitting unit 33 emits a green light when the battery 20 is completely charged, and emits the continuous red light when it is not completely charged.

The hybrid terminal 10 includes a display unit 11, a power supply unit 12, an alarm driver 15, a terminal light-emitting unit 16, and the terminal controller 13 that includes an ADC (Analog to Digital Converter) 14. The power supply unit 12 receives the DC power supply voltage from the battery 20 through the power supply terminal 4. When the battery is loaded, i.e., when the terminal controller 13 is connected to the terminal detection resistor 21 built in the battery 20 through the voltage feedback terminal 3, the terminal controller 13 detects the level of voltage received from and/or the amount of current flowing from the battery 20.

In addition, the terminal controller 13 converts an analog data representing the detected voltage level or current amount to a digital data using the ADC 14.

Further, the terminal controller 13 controls the display unit 11, the alarm driver 15, and the terminal light-emitting unit 16 to inform the user of a charge status of the battery 20, based on the converted digital data. Similar to the charger light-emitting unit 33, the terminal light-emitting unit 16 indicates the charge status of the battery 20, mainly using an LED, under the control of the controller 13. Generally, the terminal light-emitting unit 16 emits a blinking a red light when the charge status of the battery 20 becomes lower than a predetermined capacity.

The alarm driver 15 generates an alarm sound for informing the user of a low charge status of the battery 20 under the control of the terminal controller 13. That is, the alarm driver 15 generates the alarm sound when the charge status of the battery 20 becomes lower than the predetermined capacity.

The display unit 11 displays an icon indicating the charge status of the battery 20 under the control of the terminal controller 13. Generally, the display unit 11 displays the charge status of the battery 20 in stages using a battery-shaped icon, and blinks the battery-shaped icon when the charge status of the battery 20 becomes lower than the predetermined capacity.

As mentioned above, the battery, the charger, and the hybrid terminal can connect to each other through the power supply terminal 4, the voltage feedback terminal 3, the current feedback terminal 2, and the ground terminal 1, and the user can be informed of the loaded, charging, and remaining-capacity states of the battery through the four terminals.

However, when the charge status of the battery becomes lower than the predetermined capacity, the hybrid terminal having such a configuration displays only a schematic charge status of the battery using the icon, or informs the user with the LED or the alarm driver, without any function to accurately display the available battery time based on the operating mode (either the current operating mode or another operating mode set by the user) with a given remaining capacity of the battery. Generally, a battery product manual provides a definite available continuous-calling time and a definite available continuous-standby time. But, because the battery has different discharge characteristics for each function, the conventional hybrid terminal fails to correctly indicate how much time the hybrid terminal can continue to be used in each operating mode with a given remaining capacity of the battery.

SUMMARY OF THE INVENTION

Therefore, the present invention has been made in view of the above problems, and it is an object of the present invention to provide a method for informing the user of the available battery time in each operating mode of a hybrid terminal that has a plurality of operating modes and performs a function corresponding to a selection of the user.

It is another object of the present invention to provide a method for detecting the current operating mode of a hybrid terminal, and to provide a charge-related guide message and information of an available battery time, based on the discharge characteristics of a battery in a detected operating mode.

In accordance with one aspect of the present invention, the above and other objects can be accomplished by the provision of a method for informing a user of an available battery time of a battery in a hybrid terminal, which has a plurality of modes and performs a function corresponding to a selection of the user, based on the operating mode of the hybrid terminal, the method comprising the steps of: subdividing a battery current amount into a plurality of battery current amount levels for each operating mode of the hybrid terminal, and calculating an available battery time in each operating mode for each current amount level, so as to generate an available battery time table; storing the generated available battery time table in a memory of the hybrid terminal; detecting the operating mode of the hybrid terminal; detecting the amount of current in the hybrid terminal; obtaining an available battery time corresponding to the detected current amount, from the available battery time table; and displaying a text message indicating the obtained available battery time.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Now, preferred embodiments of the present invention will be described in detail with reference to the annexed drawings. In the following description, a detailed description of known functions and configurations is omitted to avoid making the subject matter of the present invention unclear. The following description of the present invention is given for a hybrid terminal having a built-in Bluetooth function as an example, but the present invention can be applied to other hybrid terminals such as a smart phone, a camera phone, a TV phone, an MP3 phone, etc.

Figure 1:
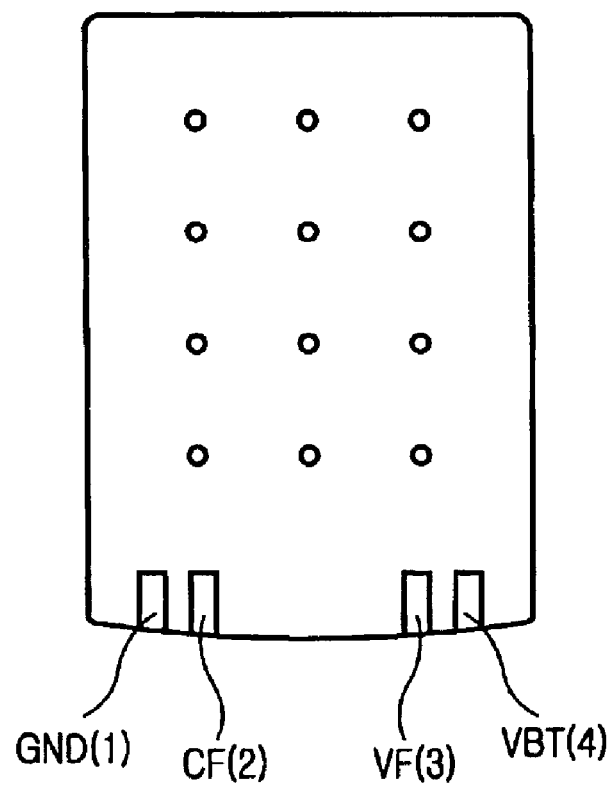
FIG. 1 is a view showing the outside of a battery of a conventional hybrid terminal.
Figure 2:
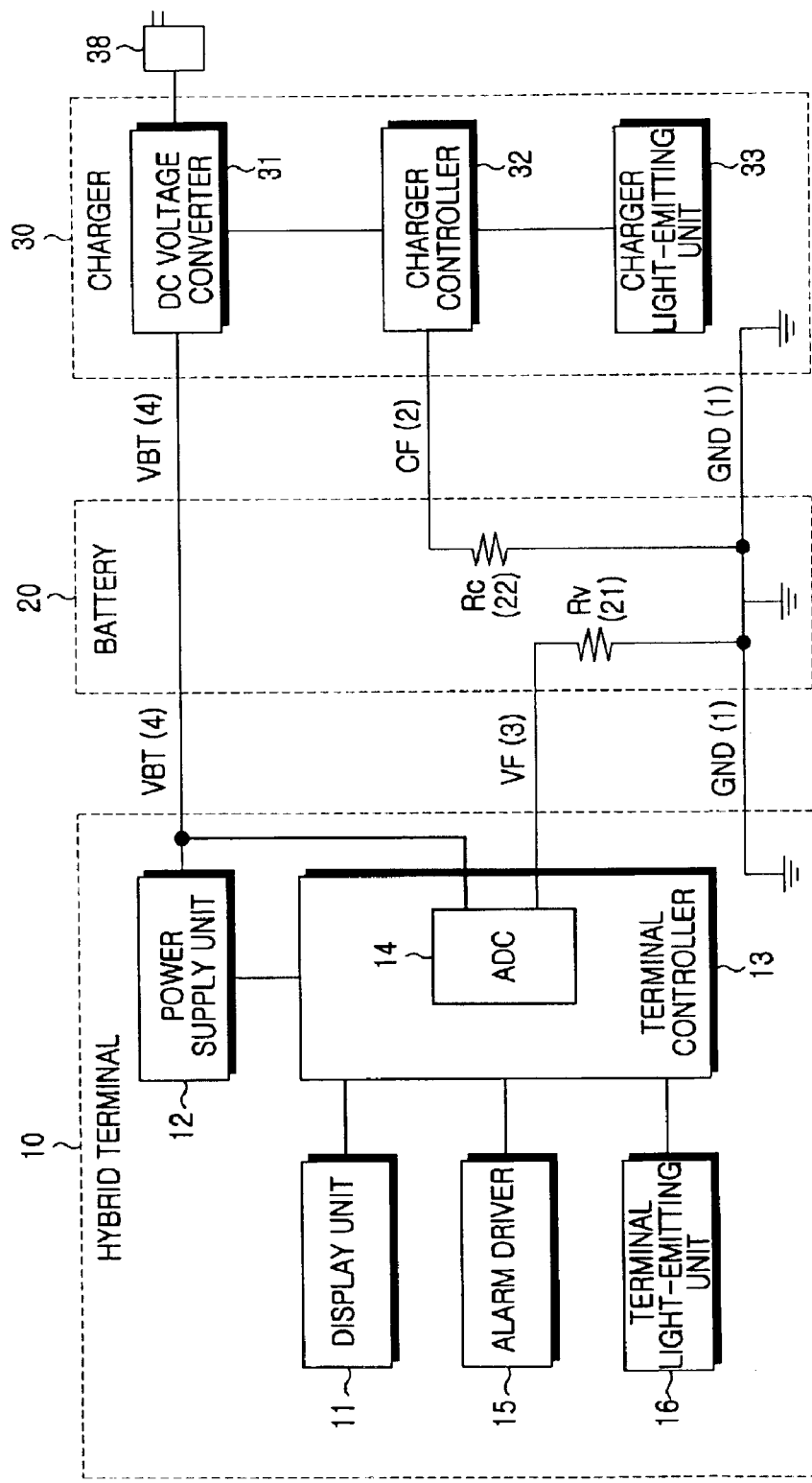
FIG. 2 is a block diagram showing the configuration of connections between the battery, the charger, and the hybrid terminal.
Figure 3:
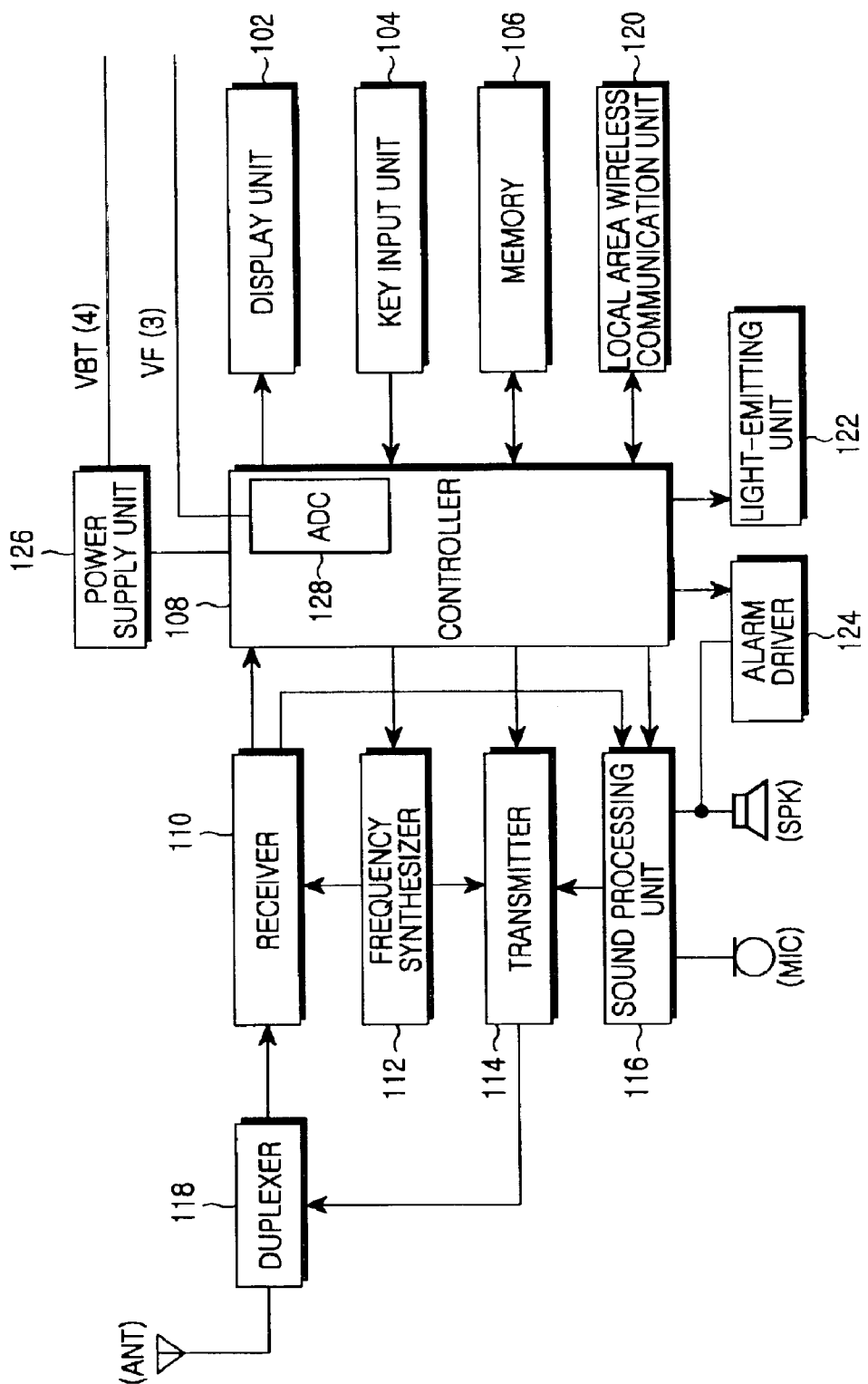
FIG. 3 is a block diagram showing a hybrid terminal according to an embodiment of the present invention.

FIG. 3 is a block diagram showing a hybrid terminal according to one embodiment of the present invention.

As shown in FIG. 3, the hybrid terminal includes a display unit 102, a key input unit 104, a memory 106, a controller 108, a receiver 110, a frequency synthesizer 112, a transmitter 114, a sound processing unit 116, a duplexer 118, a local area wireless communication unit 120, a light-emitting unit 122, an alarm driver 124, and a power supply unit 126. The key input unit 104, which includes a plurality of number and/or letter keys, generates a key data corresponding to a key pushed by the user, and outputs the generated key data to the controller 108.

The duplexer 118 obtains a signal in a predetermined band from signals received through an antenna ANT, outputs the obtained signal to the receiver 110, and outputs a signal provided from the transmitter 114 to the antenna ANT. The transmitter 114 converts a signal provided from the sound processing unit 116, combined with a signal provided from the frequency synthesizer 112, to a transmission-band signal, and outputs the converted signal to the duplexer 118.

Under the control of the controller 108, the receiver 110 outputs a sound-related signal of the received signal to the sound processing unit 116, and outputs the remaining signal of the received signal other than the sound-related signals to the controller 108. Under the control of the controller 108, the frequency synthesizer 112 generates frequency signals and outputs them to both the transmitter 114 and the receiver 110. The sound processing unit 116 decodes a signal provided from the receiver 110, and converts the decoded signal to an electric sound signal and outputs the electric sound signal to a speaker SPK. The speaker SPK converts the received electric sound signal to an audible sound and outputs the audible sound.

A microphone MIC receives an audible-frequency signal and converts the received signal to an electric signal to be output to the sound processing unit 116. The sound processing unit 116 encodes the received electric sound signal and outputs the encoded signal to the transmitter 114. The sound processing unit 116 outputs an available battery time and a battery-charging prompt message, that will be described below in detail according to the present embodiment of the present invention, through the speaker SPK.

The power supply unit 126 receives a DC power supply voltage from a battery (not shown) through the power supply terminal 4 and outputs the received DC power supply voltage to the hybrid terminal. Under the control of the controller 108, the light-emitting unit 122 emits a light indicating various states of the hybrid terminal. Under the control of the controller 108, the alarm driver 124 outputs an alarm sound for informing the user of the various states of the hybrid terminal through the speaker SPK.

Under the control of the controller 108, the local area wireless communication unit 120 performs a local area wireless communication with an other terminal, such as a personal computer (PC). Preferably, the local area wireless communication unit 120 is a Bluetooth module according to the present embodiment of the invention.

The memory 106 temporarily stores the data generated during the operation of the controller 108 and an operating program needed for the operation of the controller 108. The memory 106 preferably also stores an available battery time table according to the present embodiment of the invention.

In order to generate the available battery time table, as shown in the following Table 1, a battery current amount is subdivided into a plurality of battery current amount levels for each operating mode of the hybrid terminal, and the available battery time in each operating mode is calculated for each current amount level. As shown in the following Table 1, the Table has three categories of a function (operating mode), a current amount (mA), and an available time (minutes).

Preferably, the available battery time table as shown in the Table 1 is obtained by continuously measuring an actual available battery time at each subdivided current amount level for each of plural operating modes (or plural functions), and the obtained available battery time table is stored in the memory 106 of the hybrid terminal at the time of manufacturing the hybrid terminal. Because the embodiment of the present invention is applied to the Bluetooth phone, the operating mode category of the Table 1 is classified into a local area wireless communication mode, a wireless Internet mode, a telephone communication mode, and a standby mode.

TABLE 1

| Function (Mode) | Current Amount (mA) | Available time (Minutes) |
| --- | --- | --- |
| Local Area Wireless Communication Mode | 20 mA | 50 min |
| | 40 mA | 40 min |
| | 60 mA | 30 min |
| | 80 mA | 20 min |
| | 100 mA | 10 min |
| Wireless Internet Mode | 30 mA | 50 min |
| | 60 mA | 40 min |
| | 90 mA | 30 min |
| | 120 mA | 20 min |
| | 150 mA | 10 min |
| Telephone Communication Mode | 50 mA | 50 min |
| | 100 mA | 40 min |
| | 150 mA | 30 min |
| | 200 mA | 20 min |
| | 250 mA | 10 min |
| Standby Mode | 2 mA | 50 min |
| | 4 mA | 40 min |
| | 6 mA | 30 min |
| | 8 mA | 20 min |
| | 10 mA | 10 min |

It will be readily recognized that when the present invention is applied to the camera phone the local area wireless communication mode is replaced with a camera mode, and when the present invention is applied to the MP3 phone, the local area wireless communication mode is replaced with an MP3 mode.

Under the control of the controller 108, the display unit 102 displays various information on the hybrid terminal, and also receives and displays key data generated from the key input unit 104 and various information signals of the controller 108. According to the embodiment of the present invention, the display unit 102 displays the available battery time and the battery-charging prompt message to prompt the user to charge the battery. According to the embodiment of the present invention, the control unit 108 controls the overall operation of the hybrid terminal, and detects the current operating mode of the hybrid terminal.

In addition, the controller 108 detects the amount of current flowing into the battery through the voltage feedback terminal 3, and converts an analog signal representing the detected current amount to a digital data, using the ADC 128. Further, the controller 108 obtains the available battery time corresponding to the detected current amount from the available battery time table, and controls the display unit 102 and the sound processing unit 116 to output a text message and a sound message indicating the obtained available battery time, respectively.

When the obtained available battery time is less than a predetermined reference time, the controller 108 controls the display 102 and the sound processing unit 116 to output a text message and a sound message for prompting the user to charge the battery, respectively.

Figure 4:
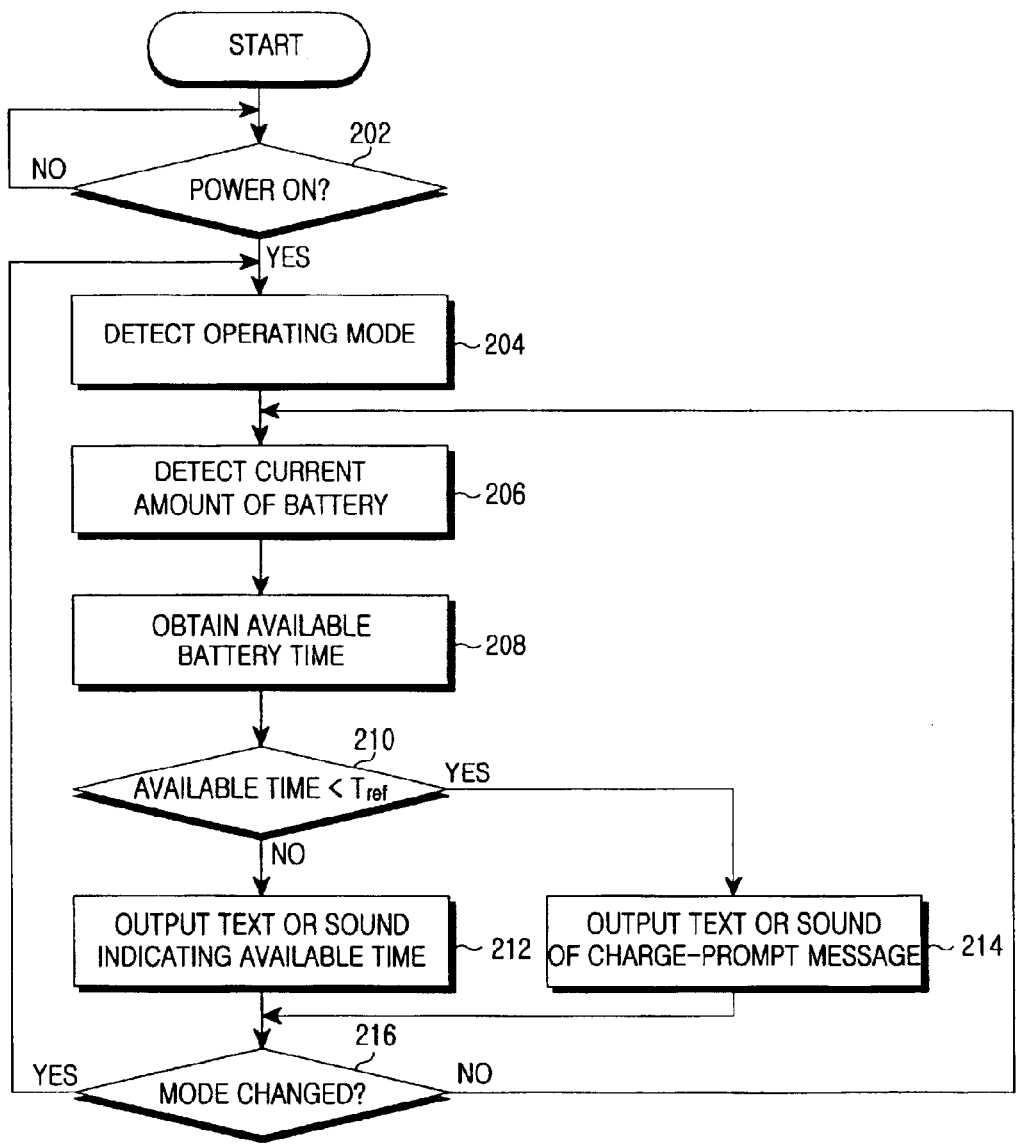
FIG. 4 is a flowchart showing a method for informing the user of an available battery time according to the embodiment of the present invention.

Referring to FIG. 4, a description is now given of a method for informing the user of the available battery time in the hybrid terminal having the configuration as mentioned above.

When the hybrid terminal is powered on (Step 202), it is detected that the hybrid terminal is in a standby mode as an initial operating mode (Step (204). In Step 206, the controller 108 detects, as analog data, the amount of current flowing into the hybrid terminal through the voltage feedback terminal 3, and converts the analog current amount data to digital data using the ADC 128. Thereafter, in Step 208, the controller 108 obtains the available battery time corresponding to the detected current amount in the standby mode (the current operating mode), or an operating mode set by the user, from the available battery time table stored in the memory 106.

When the available battery time corresponding to the detected current amount in the standby mode as the current operating mode, or an operating mode set by the user is obtained in Step 208, the controller compares the obtained available battery time with a predetermined reference time ($T_{ref}$) in Step 210. If the comparison result is that the available battery time is less than the predetermined reference time ($T_{ref}$), the controller 108 controls the display unit 102 and/or the sound processing unit 116 to output the battery-charging prompt message in order to prompt the user to charge the battery, in Step 214. On the contrary, if the comparison result is that the available battery time is more than the reference time ($T_{ref}$), the controller controls the display unit 102 and/or the sound processing unit 116 to output the available battery time in Step 212.

Figure 5:
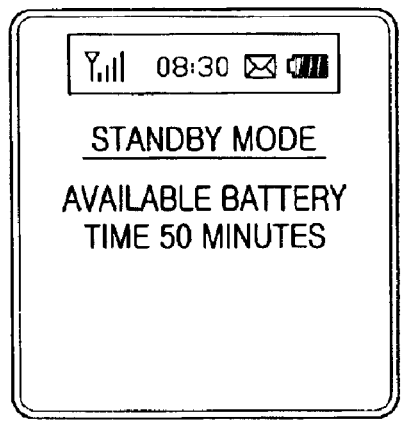
FIGS. 5a to 5d are examples of the screen of the hybrid terminal on which an available battery time and a battery-charging prompt message are displayed.
Figure 5:
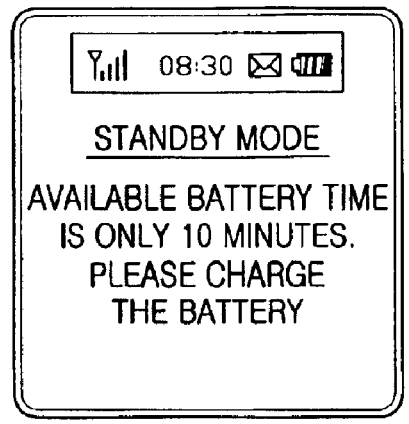
Figure 5:
Figure 5:

For example, in the case where the reference time ($T_{ref}$) is set to 20 minutes and the controller 108 detects a current amount of 2 mA when the current operating mode is the standby mode with no other or different operating mode set by the user, as shown in Table 1, the available battery time in the current (standby) operating mode is 50 minutes, based on the detected current amount, referring to Table 1. Because the available battery time (50 minutes) is more than the predetermined reference time ($T_{ref}$), under the control of the controller 108, the display unit 102 displays a text message, "Standby Mode Available battery time is 50 minutes.", as shown in FIG. 5a, and the sound processing unit 116 outputs a sound message, "The current operating mode is standby mode. Available battery time 50 minutes.", through the speaker SPK.

On the other hand, when the controller 108 detects a current amount of 10 mA, the available battery time in the current standby mode is 10 minutes, referring to Table 1.

Accordingly, under the control of the controller 108, the display unit 102 displays a text message, "Standby Mode Available battery time is only 10 minutes. Please charge the battery.", as shown in FIG. 5b, and the sound processing unit 116 outputs a sound message, "The current operating mode is standby mode. Available battery time is only 10 minutes. Please charge the battery.", through the speaker SPK.

In Step 216, when it is detected that the operating mode of the hybrid terminal is changed, for example, from the standby mode to the local area wireless mode, the controller 108 returns to Step 204 to detect the changed operating mode and then detects the battery current amount (Step 206). Thereafter, the controller 108 controls the display unit 102 and the sound processing unit 116 to output text or sound indicating the available battery time corresponding to the detected battery current amount in the new operating mode (i.e. local area wireless communication mode). For example, when the controller 108 of the hybrid terminal, whose operating mode is changed from the standby mode to the local area wireless communication mode, detects a battery current amount of 40 mA, the available battery time is 40 minutes in the current operating mode (i.e. local area wireless mode).

Because the available battery time is more than the predetermined reference time ($T_{ref}$), under the control of the controller 108, the display unit 102 displays a text message, "Local Area Wireless Communication Mode Available battery time is 40 minutes.", as shown in FIG. 5c, and the sound processing unit 116 outputs a sound message, "The current operating mode is local area wireless communication mode. Available battery time is 40 minute.", through the speaker SPK.

On the other hand, in the case where the controller 108 detects a current amount of 100 mA, the available battery time in the current operating mode is 10 minutes. Accordingly, under the control of the controller 108, the display unit 102 displays a text message, "Local Area Wireless Communication Mode Available battery time is only 10 minutes. Please charge the battery.", as shown in FIG. 5d, and the sound processing unit 116 outputs a sound message, "The current operating mode is local area wireless communication mode. Available battery time is only 10 minutes. Please charge the battery", through the speaker SPK.

As mentioned above, according to the present invention, an available battery time table, which describes an available battery time corresponding to each battery current amount for each operating mode, is generated and stored in memory, the current operating mode of the hybrid terminal or the operating mode set by the user and the current amount are detected, and the available battery time corresponding to both the detected current amount and the detected operating mode is output by the text and/or a sound message based on the available battery time table, thereby informing the user of the available battery time. This operation of informing the user of such an available battery time may be performed at predetermined time intervals or according to the request of the user, as well as each time a function is activated. In addition, the operation of informing the user of the available battery time can be terminated by the user or by turning off the hybrid terminal.

As apparent from the above description, the present invention has an advantage in that, because the user is informed of the available battery time for each of the plurality of operating modes, with a given remaining capacity of the battery, the user can optimally use the hybrid terminal and suitably charge the battery before the battery is fully discharged.

As mentioned above, the embodiment of the present invention is given for a Bluetooth phone as an example, but the present invention can be applied to any other hybrid terminals such as a smart phone, a camera phone, a TV phone, an MP3 phone, etc, without departing from the scope of the present invention. Accordingly, the scope of the present invention should not be limited to the description of the embodiment, but defined by the accompanying claims as well as equivalents thereof.

What is claimed is:

1. A method for informing a user of an available battery time of a battery in a hybrid terminal, which has a plurality of modes and performs a plurality of functions corresponding to a selection of the user, based on the operating mode of the hybrid terminal, the method comprising the steps of:

subdividing a battery current amount into a first plurality of current amount levels for a first operating mode of the hybrid terminal, subdividing a battery current amount into a second plurality of current amount levels for a second operating mode of the hybrid terminal, and calculating the available battery time in each of the first and second operating modes for each respective first and second plurality of current amount levels, so as to generate an available battery time table;

storing the generated available battery time table in a memory of the hybrid terminal;

detecting the operating mode of the hybrid terminal;

detecting the amount of current provided to the hybrid terminal;

obtaining the available battery time corresponding to the detected operating mode and the detected current amount, from the available battery time table; and displaying a text message indicating the obtained available battery time.

2. The method as set forth in claim 1, wherein a different current operating mode set by the user is detected in the step of detecting the operating mode.

3. The method as set forth in claim 1, wherein the user is informed of the available battery time at predetermined time intervals.

4. The method as set forth in claim 1, further comprising the step of:

outputting a sound indicating the obtained available battery time, after displaying the text message indicating the obtained available battery time.

5. The method as set forth in claim 1, further comprising the step of:

displaying an other text message corresponding to a battery-charging prompt message to prompt the user to charge the battery, when the available battery time corresponding to the detected operating mode is less than a predetermined reference time.

6. The method as set forth in claim 5, further comprising the step of:

outputting a sound corresponding to the battery-charging prompt message, after displaying the other text message of the battery-charging prompt message.

7. The method as set forth in claim 1, wherein the first and second operating modes are a Local Area Wireless Communication Mode and a Wireless Internet Mode, respectively.

* * * * *